US006280906B1

(12) United States Patent
Braat et al.

(10) Patent No.: US 6,280,906 B1
(45) Date of Patent: Aug. 28, 2001

(54) METHOD OF IMAGING A MASK PATTERN ON A SUBSTRATE BY MEANS OF EUV RADIATION, AND APPARATUS AND MASK FOR PERFORMING THE METHOD

(75) Inventors: Josephus J. M. Braat, Eindhoven; Jan Verhoeven, Kockengen, both of (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/440,593

(22) Filed: Nov. 15, 1999

(30) Foreign Application Priority Data

Dec. 22, 1998 (EP) .................................................. 98204383

(51) Int. Cl.[7] ....................................................... G03C 5/00
(52) U.S. Cl. ......................... 430/296; 430/942; 430/966; 430/967
(58) Field of Search .................................. 430/296, 942, 430/966, 967

(56) References Cited

U.S. PATENT DOCUMENTS

| 5,144,363 | 9/1992 | Wittekoek et al. | ..................... 355/53 |
| 5,153,898 | 10/1992 | Suzuki et al. | .......................... 378/34 |
| 5,191,200 | 3/1993 | Van Der Werf et al. | ......... 250/201.4 |

FOREIGN PATENT DOCUMENTS

| 0779528A2 | 6/1997 | (EP) . |
| 9733204A1 | 9/1997 | (WO) . |

OTHER PUBLICATIONS

"Front–End Design Issues in Soft X–Ray Projection Lithography", by N. Ceglio et al., Applied Optics, vol. 32, No. 34, Dec. 1993, pp. 7050–7056.

"X–Ray Cerenkov Radiation, Theory and Experiment", by V.A. Bazylev et al., Sov. Phys. JETP, vol. 54, Nov. 1981, pp. 884–892.

Primary Examiner—Christopher G. Young
(74) Attorney, Agent, or Firm—Steven R. Biren

(57) ABSTRACT

An EUV radiation source unit (10) for use in a lithographic projection apparatus to illuminate a mask pattern (22) which is to be projected on a substrate (W) comprises an electron source (12) and a medium in which the electrons of the source generate EUV Cherenkov radiation (PB). The wavelengths of the Cherenkov radiation and the multilayer structure of the mirrors (31–34) of the projection system (30) are adapted to each other, so that these mirrors show a maximum reflectivity. The medium forms part of the mask (MA) so that a mirror condenser system is no longer needed. In this way, an efficient transmission of radiation (PB) from the source to the substrate is obtained.

6 Claims, 3 Drawing Sheets

METHOD OF IMAGING A MASK PATTERN ON A SUBSTRATE BY MEANS OF EUV RADIATION, AND APPARATUS AND MASK FOR PERFORMING THE METHOD

BACKGROUND OF THE INVENTION

The invention relates to a method of imaging a mask pattern, present in a mask, on a substrate by means of EUV radiation, using a mirror projection system and to a method for manufacturing devices.

The invention also relates to a lithographic apparatus and to a mask which are suitable for performing the method.

A lithographic apparatus is used, inter alia, in the manufacture of integrated electronic circuits, or ICs, for imaging an IC mask pattern, present in a mask, each time on a different IC area of a substrate. This substrate, which is coated with a radiation-sensitive layer, provides space for a large number of IC areas. The lithographic apparatus may also be used in the manufacture of other devices, for example, liquid crystalline display panels, integrated or planar optical systems, charge-coupled detectors (CCDs) or magnetic heads.

Since it is desirable to accommodate an increasing number of electronic components in an IC, increasingly smaller details, or line widths, of IC patterns must be imaged. Thus, increasingly stricter requirements are imposed on the imaging quality and the resolving power of the projection system which is usually a lens system in the current lithographic apparatuses. The resolution, which is a measure of the smallest detail which can still be imaged satisfactorily, is proportional to $\lambda/NA$, in which $\lambda$ is the wavelength of the imaging, or projection, beam and NA is the numerical aperture of the projection system. To increase the resolution, the numerical aperture may, in principle, be increased and/or the wavelength may be reduced. In practice, an increase of the numerical aperture, which is currently already fairly large, is not very well possible because this reduces the depth of focus of the projection lens system, which is proportional to $\lambda/NA^2$, while it becomes too difficult to correct for the required image field.

The requirements to be imposed on the projection lens system may be alleviated, or the resolution may be increased, while maintaining these requirements, if a step-and-scanning lithographic apparatus is used instead of a stepping lithographic apparatus. In a stepping apparatus, a full-field illumination is used, i.e. the entire mask pattern is illuminated in one operation and imaged as a whole on an IC area of the substrate. After a first IC area has been illuminated, a step is made to a subsequent IC area, i.e. the substrate holder is moved in such a way that the next IC area is positioned under the mask pattern, whereafter this area is illuminated, and so forth until all IC areas of the substrate are provided with the mask pattern. In a step-and-scanning apparatus, only a rectangular or circular segment-shaped area of the mask pattern and hence also a corresponding sub-area of a substrate IC area is each time illuminated, and the mask pattern and the substrate are synchronously moved through the illumination beam, while taking the magnification of the projection lens system into account. A subsequent area of the mask pattern is then each time imaged on a corresponding sub-area of the relevant IC area of the substrate. After the entire mask pattern has been imaged on an IC area in this way, the substrate holder performs a stepping movement, i.e. the beginning of the next IC area is moved into the projection beam and the mask is set to its initial position whereafter said next IC area is scan-illuminated via the mask pattern.

If even smaller details are to be imaged satisfactorily with a step-and-scanning lithographic apparatus, it is still possible to reduce the wavelength of the projection beam. In the current step-and-scanning apparatuses, deep UV (DUV) radiation, i.e. radiation having a wavelength of the order of several hundred nanometers, for example 245 nm or 193 nm from, for example, an excimer laser is already used. Another possibility is the use of extreme UV (EUV) radiation, also referred to as soft X-ray radiation, with a wavelength in the range of several nm to several tens of nm. Extremely small details, of the order of 0.1 $\mu$m or less, can be satisfactorily imaged with such a radiation.

Since there is no suitable material with which lenses can be made available for EUV radiation, a mirror projection system must be used for imaging the mask pattern on the substrate, instead of a hitherto conventional projection lens system. For forming a suitable illumination beam from the radiation of the radiation source unit, mirrors are also used in the illumination system.

The article "Front-end design issues in soft X-ray projection lithography" in Applied Optics, vol. 32, no. 34, Jan. 12, 1993, pp. 7050–56 describes a lithographic projection apparatus in which EUV radiation is used. The illumination system of this apparatus comprises a condenser system in the form of three mirrors and the imaging, or projection, system comprises four mirrors. The radiation source unit comprises a high-power laser generating a plasma in a medium emitting EUV radiation. This radiation source unit is known as Laser Produced Plasma Source (LPPS). Said medium may be a solid, a liquid or a gaseous medium, and the generated EUV radiation has a wavelength of 13 nm.

It is a great problem in EUV lithographic apparatuses to illuminate the substrate with a sufficiently high intensity. A first cause of this problem is that radiation sources emitting radiation at the envisaged wavelength, in the range of 13 nm, are not very efficient and only supply a limited quantity of radiation. Moreover, the mirrors are considerably less than 100% reflecting. Each of these mirrors has a multilayer structure whose composition is adapted as satisfactorily as possible to the wavelength of the projection beam used. Examples of such multilayer structures are described in U.S. Pat. No. 5,153,898. A multilayer structure which is often referred to in literature is the structure consisting of silicon layers alternating with molybdenum layers. For radiation supplied by a plasma source, these layers theoretically have a reflection of the order of 73% to 75%, but in practice, the reflection is currently in the order of 65%. When said number of seven mirrors is used with a reflection of 68% each, only 6.7% of the radiation emitted by the source reach the substrate. In practice, this means for a lithographic apparatus that the illumination time must be relatively long so as to obtain the desired quantity of radiation energy on an IC area of the substrate, while for a scanning apparatus particularly the scanning rate is relatively short. However, it is essential for these apparatuses that the scanning rate is as high as possible and the illumination time is as short as possible so that the throughput, i.e. the number of substrates which can be illuminated per unit of time, is as high as possible.

SUMMARY OF THE INVENTION

It is an object of the present invention to provide a method of the type described in the opening paragraph with which a higher radiation output on the substrate is obtained. This method is characterized in that use is made of an electron beam and of a medium in which Cherenkov EUV radiation is generated by electrons, and in that this medium is constituted by a layer of the mask.

As described in the article by V. A. Bazylev et al. "X-ray Cherenkov radiation. Theory and experiment" in Sov. Phys. JETP 54 (1981) page 884, Cherenkov radiation is produced if a material is bombarded with electrons whose velocity is larger than the phase velocity of the Cherenkov radiation in the medium. This article comprises a theoretical discourse about the Cherenkov radiation and states the conditions under which this radiation may be produced. Generally, a large change of the dielectric constant occurs for a material around the molecular absorption edges of the material. If this material is bombarded with a high energetic electron beam, the intensity of the Cherenkov radiation has a maximum at that energy at which the dielectric constant has a minimum. The selection of the absorption edge is determined by the desired wavelength of the Cherenkov radiation. The Bazylev article states carbon as an example of a solid-state medium in which Cherenkov radiation can be generated. The use of the radiation in a lithographic apparatus is mentioned, but the energy of the electrons is of the order of 1 GeV, and the generated Cherenkov radiation is hard X-ray radiation, not soft X-ray radiation or EUV radiation.

By using a layer of the mask as a medium for generating the Cherenkov radiation, a mirror condenser system no longer needs to be used for capturing the radiation beam emitted by the Cherenkov source and by giving this beam the desired shape before it reaches the mask. Since such a condenser system comprises a plurality of mirrors, for example, three mirrors, their omission may lead to a considerable increase of the quantity of radiation on the mask.

As compared with, for example, an LPPS, the Cherenkov radiation source has the advantages that it can be implemented in a more compact manner for a comparable radiation intensity, and that it is cleaner, i.e. no particles are released from the medium, which particles could be deposited on the mirrors of the projection system and contaminate them.

A preferred embodiment of the novel method is further characterized in that a layer of silicon is used as a Cherenkov radiation-generating medium.

When using silicon as a medium, radiation having an energy of 99.7 eV and a wavelength of 12.44 nm is produced, which is very suitable for lithographic apparatuses. Cherenkov radiation of this wavelength is obtained by bombarding the Si medium with electrons having an energy of several MeV.

The method may be further characterized in that use is made of an electron beam which is slant with respect to the normal to the substrate.

Then it is provided that electrons which are not used for the generation of Cherenkov EUV radiation are reflected at the mask and prevented that such electrons passes through the mask, so that no special measures have to be taken to capture electrons passing through the mask.

The invention also relates to a lithographic projection apparatus which is suitable for performing the novel method. This apparatus, which comprises a radiation source unit for supplying an imaging beam, a mask holder for accommodating a mask, a substrate holder for accommodating a substrate and a mirror projection system arranged between the mask holder and the substrate holder for imaging a mask pattern on the substrate, is characterized in that the radiation source unit comprises an electron source and a medium in which EUV Cherenkov radiation is generated by electrons of the electron source, and in that this medium is constituted by a layer of the mask, on which layer the mask pattern to be imaged is provided in the form of a pattern of EUV radiation-obstructing areas.

With respect to the previously proposed lithographic apparatuses, this apparatus has the advantage that the illumination system is compact and that the imaging beam at the area of the substrate has a relatively large intensity.

This intensity is even further increased in a preferred embodiment of this apparatus in which the mirrors of the projection system comprise a multilayer structure of first layers of a first material alternating with second layers of a second material, and is further characterized in that said layer of the mask comprises a material which is equal to one of the two materials of the mirrors.

As regards the wavelength, an ideal combination of radiation source and mirror layers is then obtained. Since the electron-bombarded medium comprises the same material as one of said first and second layers of the mirrors, the generated EUV radiation has exactly the wavelength for which the mirrors are maximally reflective. For this wavelength, the reflection of the mirrors, is not 73% to 75%, but 78%, i.e. 3% to 5% more. For a lithographic apparatus which no longer comprises a condenser system and whose projection system comprises four mirrors, this means that, in principle, 37% of the EUV radiation emitted by the source can reach the substrate. As compared with the 11% of the apparatus mentioned hereinbefore, in which a condenser system is used and the seven mirrors have a reflection of 73%, this results in a gain factor of more than 3.

The lithographic apparatus is further preferably characterized in that means are provided for scanning the electron beam in one direction across the substrate.

A strip-shaped EUV radiation source is thereby obtained. The means for scanning the electron beam may consist of the known deflection plates which are already frequently used in apparatuses operating with electron beams, such as television apparatuses.

The invention also relates to a lithographic mask which is suitable for performing the method. This mask, which has a mask pattern in conformity with the pattern to be provided on the substrate, is characterized in that it comprises a layer of material in which EUV Cherenkov radiation is generated by electrons incident thereon, and in that the mask pattern is constituted by a pattern of EUV radiation-obstructing areas.

This mask is preferably further characterized in that said layer consists of silicon.

The mask may be further characterized in that said areas consist of tungsten.

These and other aspects of the invention are apparent from and will be elucidated with reference to the embodiments described hereinafter.

DESCRIPTION OF THE PREFERRED EMBODIMENTS

Figure 1:
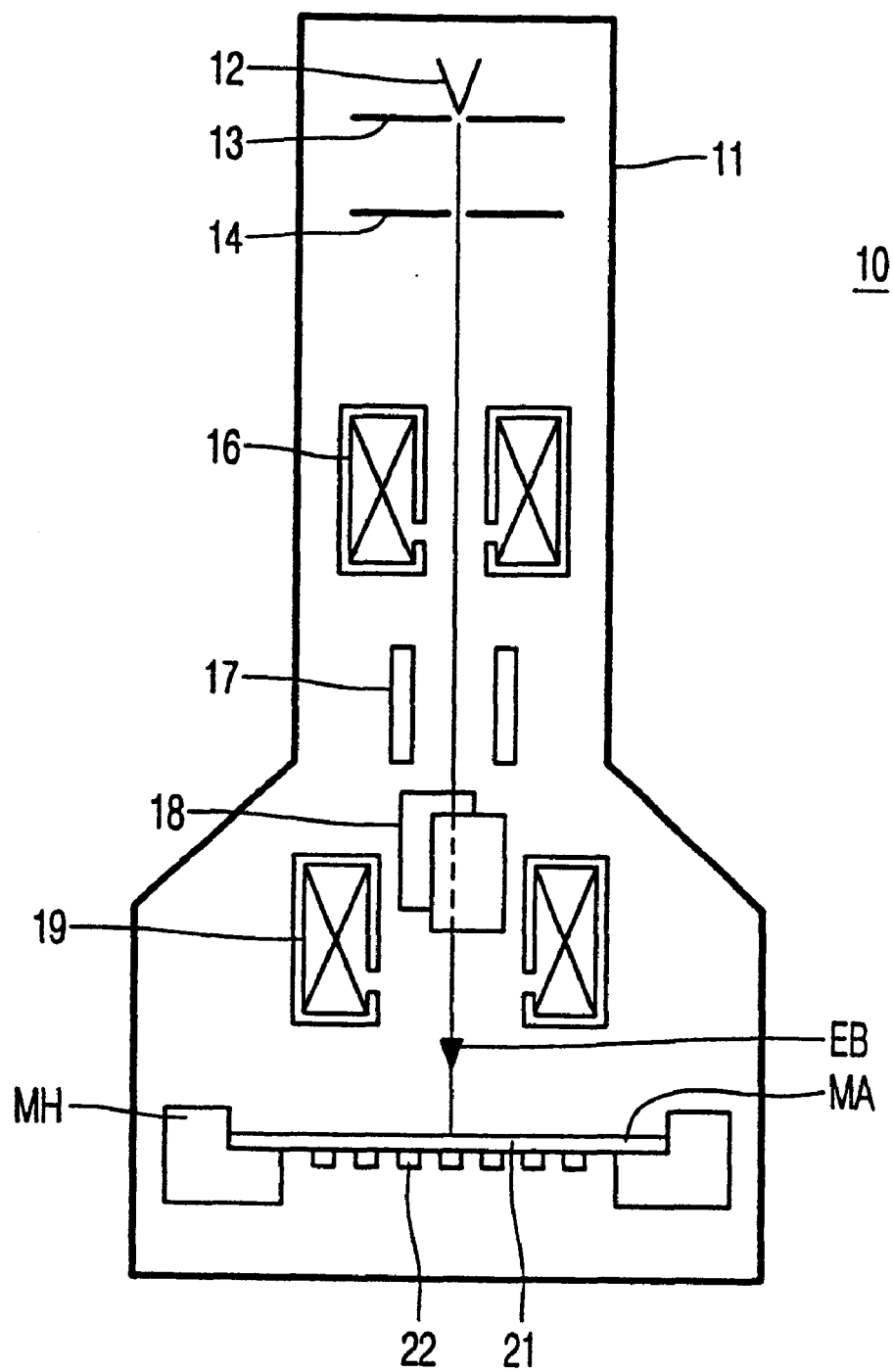
FIG. 1 shows an embodiment of a radiation source unit according to the invention.

FIG. 1 shows diagrammatically an embodiment of the radiation source unit 10 for supplying EUV Cherenkov radiation. The components of this unit are arranged in an evacuated holder 11. These components are an electron gun 12 and a drive electrode 13 which concentrates the electrons supplied by the gun to an electron beam EB and accelerates these electrons. The electron beam consecutively passes a first electromagnetic focusing lens 15, a first set of deflection plates 17 for deflecting the electron beam in the X direction, possibly a second set of deflection plates 17 for deflecting the electron beam in the Y direction, and a second electromagnetic focusing lens 19, and is finally incident on a medium 21.

In the medium 21, optical Cherenkov radiation having a given wavelength is generated by the electron beam if the electrons have a velocity which is larger than the phase velocity of the optical radiation in the medium. To this end, the dielectric constant $\epsilon(E)$ of the medium should be larger than 1 for the relevant wavelength. For short-wave Cherenkov radiation, this condition is only fulfilled around the absorption edges of the medium. The Cherenkov radiation has a narrow wavelength band around the absorption edges. Generally, the dielectric constant of a material has a maximum value for a photon energy around the energy level of an absorption line or band of the material, namely at the low-energy side of such a band, as described in the above-mentioned article by Bazylev in Sov. Phys. JETP, 54 (5), November 1981. The Cherenkov radiation thus exhibits a maximum for this photon energy.

According to the invention, the medium 21 is constituted by the substrate of a mask MA having a pattern 22, shown diagrammatically, which is provided on the lower side of the mask and must be imaged on a substrate. This substrate, or wafer, is denoted by W in FIG. 2.

This Figure diagrammatically shows the main components of an embodiment of a lithographic projection apparatus according to the invention. The mirror projection system 30 of this apparatus comprises four mirrors 31, 32, 33 and 34 which image the mask pattern 22 in the radiation-sensitive layer WR on the substrate W by means of the beam of Cherenkov radiation PB. For the sake of simplicity, the mirrors are shown as plane mirrors, but actually these mirrors are concave or convex and the mirror system is designed in such a way that the desired sharp image of the mask pattern in the radiation-sensitive layer is realized with a reduction of, for example, four times. The design of the mirror projection system is not a subject of the present invention.

Figure 3:
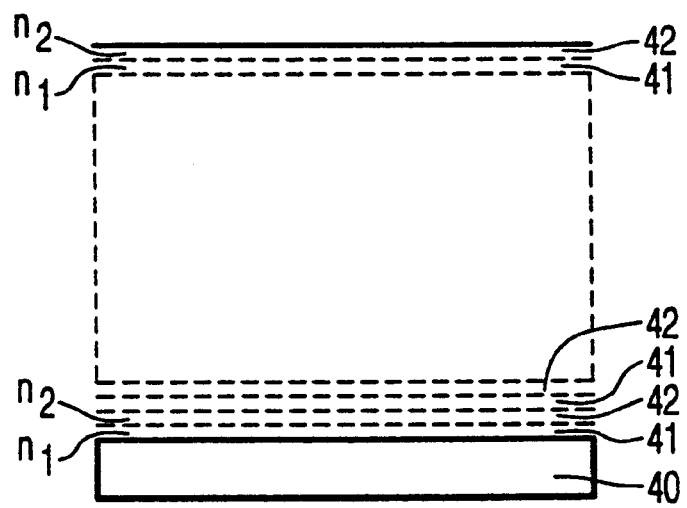
FIG. 3 shows a multilayer structure of the mirrors of the projection system of this apparatus.

To obtain the desired reflection in the desired wavelength range, each mirror has a special layer structure as is shown diagrammatically in FIG. 3. This Figure shows a part of the mirror 31 in a cross-section. The mirror consists of a substrate 40 which is provided with a large number of alternating layers 41 and 42 having a refractive index $n_1$, and $n_2$, respectively. The mirrors 32, 33 and 34 have the same layer structure. The layers 41 and 42 preferably consist of silicon and molybdenum, respectively, which materials have been proposed hereinbefore as very suitable materials for mirrors in EUV lithographic apparatuses. Mirrors having an Si—Mo layer structure have a good reflection for radiation at a wavelength in the range around 13 nm, notably for radiation at a wavelength of 12.44 nm, for which also satisfactory radiation-sensitive materials, also referred to as photoresists, for EUV lithography are available.

Figure 4:
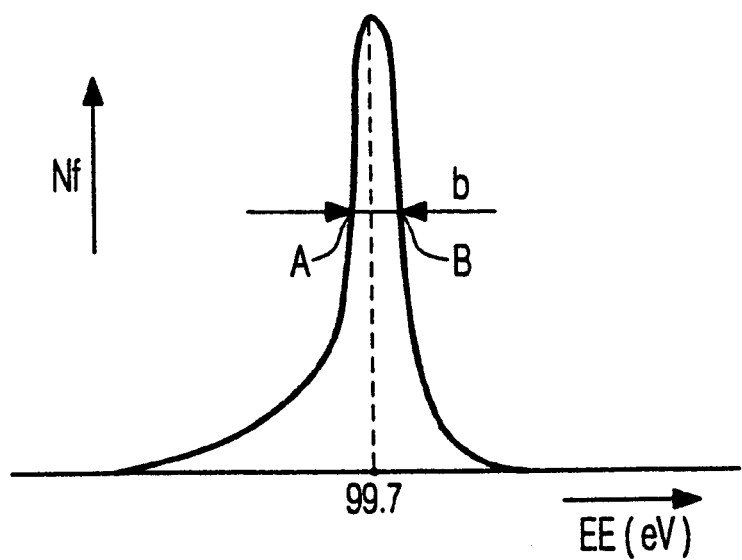
FIG. 4 shows the variation of the photon density as a function of the electron energy in the radiation source unit.

According to the invention, radiation of such a wavelength is obtained by using a thin wafer of silicon for the medium 21, or substrate of the mask MA. The L absorption edge of this material is at 99.7 eV so that an electron beam EB generates Cherenkov radiation at a wavelength of 12.44 nm in this material. It is thereby achieved that a maximal part of the radiation supplied by the radiation source unit and received by the first mirror 31 can reach the radiation-sensitive layer WR. The Cherenkov radiation having a wavelength of 12.44 nm, which corresponds to a photon energy of 99.7 eV, can be obtained by bombarding the silicon wafer with electrons having an energy of several MeV. It has been theoretically proved that Cherenkov radiation is generated at a wavelength of 12.44 nm if an electron current of 100 $\mu$A and an electron energy of 3 MeV is passed through a silicon layer having a thickness of 10 $\mu$m. For the curve representing the number of photons N per energy level E for this radiation, which curve is shown in FIG. 4, it holds that the distance between the points A and B on the curve for which the number of photons is half the maximum number of photons in the center of the curve, also referred to as half-value width (FWHM), is 0.8 eV around the central value of 99.7 eV. This means that the wavelength spread of the radiation is less than 1% so that the radiation is satisfactorily monochromatic. The quantity of photons generated per second by the electron current of 100 $\mu$A is at least $10^{11}$. These photons are irradiated within a cone whose axis extends at an angle of approximately 8.4° to the direction of the electron beam EB. The half-value width (FWHM) of the apex angle of this cone, i.e. the angular distance between the directions for which the intensity is half the central intensity is approximately 1.4° so that the photon beam can be received and converged or diverged by mirrors which are not too large.

For generating optical Cherenkov radiation, it generally holds that the material for the medium 21 is selected for its molecular absorption edges and for the wavelength of the radiation to be generated. It holds that with an increasing energy of the electrons, the wavelength of the generated radiation will be smaller. The energy level of the K, L or M absorption edge of the medium material must correspond to the energy of the electrons. The K, L and M absorption edges are the extrema in the curve representing the variation of the atomic dispersion factor as a function of the frequency of the generated radiation. A strong change of the dielectric constant occurs around an absorption edge. Due to the anomalous variation of the dielectric constant around an absorption edge of the medium, the quantity of generated radiation at the wavelength associated with this absorption edge is relatively large.

The reflection by the multilayer structure of the mirrors 31, 32, 33 and 34 is based on the interference of the radiation components coming from the different transitions. The reflection per transition is determined by the optical contrast, hence the difference between the refractive indices, or dielectric constants, of the two layers associated with the relevant transition. An important aspect of the use of silicon as a material for the radiation-generating medium 21 in radiation source unit 10 is that, due to the anomalous variation of the dielectric constant in this material, the radiation generated therein at the specific wavelength also has a higher contrast at the transitions within the multilayer structure of the mirrors, so that the reflection coefficient of these mirrors is larger for this specific wavelength than for other wavelengths.

Instead of silicon, another material may be chosen for the radiation-generating medium, for example, berilium (Be) for a wavelength of 11,5 nm, provided that this material has a favorable energy level for one of its absorption edges. The multilayer structure of the mirrors is then also preferably adapted, i.e. one of its materials is the same as the material chosen for the radiation-generating medium.

It has hitherto been assumed that the material of the medium 21 is a pure material with which radiation having a given intensity can be obtained. Since the intensity of the generated radiation is strongly dependent on the dispersion in the materials, the radiation output can be enhanced by changing the chemical composition of the medium material and hence the dispersion therein. Moreover, the wavelength of the generated radiation then also changes, which may sometimes be desirable in practice.

Figure 2:
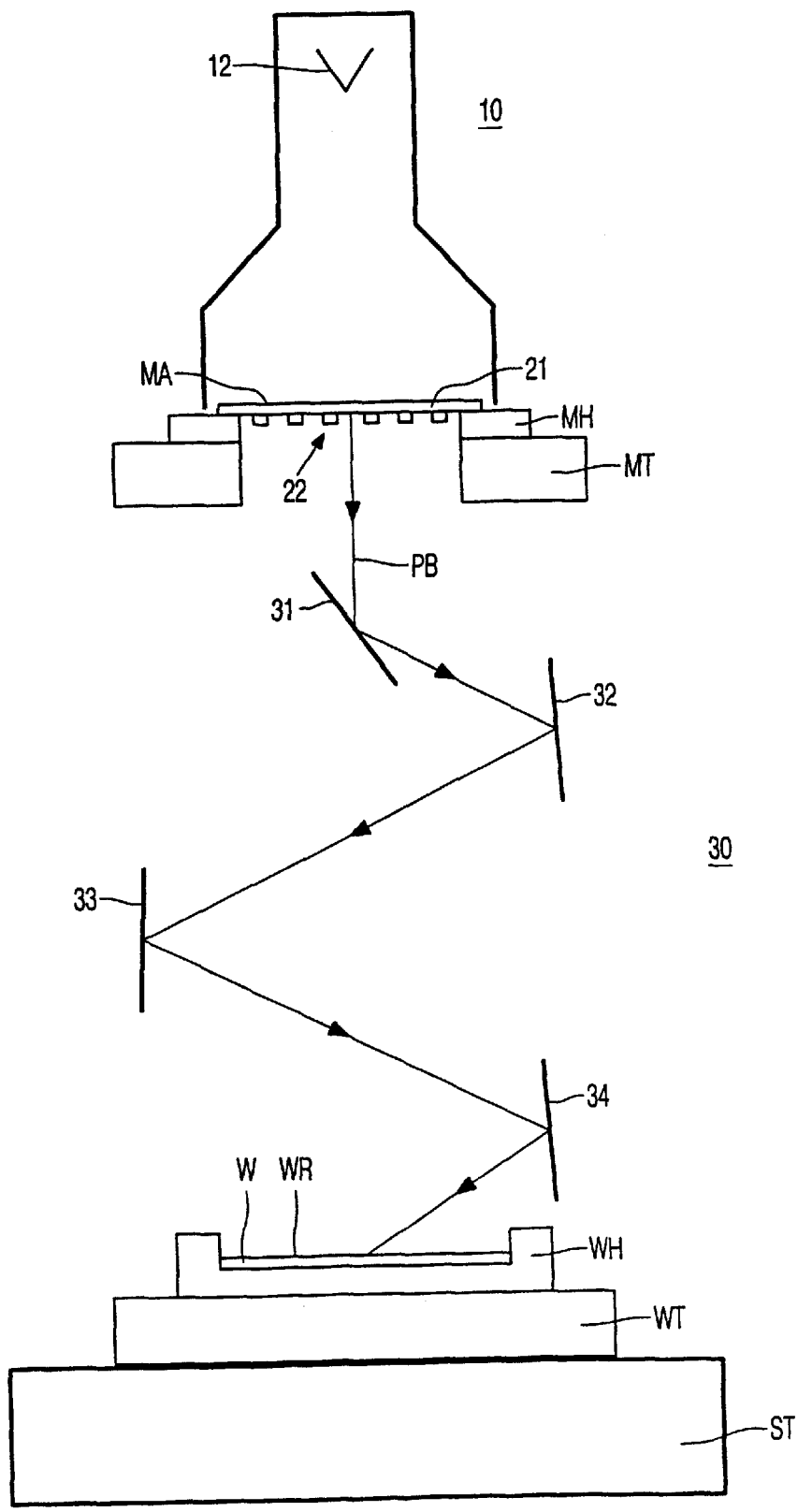
FIG. 2 shows an embodiment of a lithographic projection apparatus provided with such a radiation source unit.

As is shown in FIG. 2, the mask MA is arranged in a mask holder MH which may form part of a mask table MT. The mask holder and mask table may be implemented in various ways. The substrate W provided with the radiation-sensitive layer WR is arranged in a substrate holder WH which forms part of a substrate table WT. This holder and table may also be implemented in various ways. The substrate table may move the substrate holder and the substrate in two mutually perpendicular directions, the X and Y directions, with respect to the projection system 30 and the mask holder, so that, after illumination of an IC area on the substrate, a subsequent IC area can be placed under the mask and the projection system, in other words, steps can be made. The substrate table WT may be supported, for example, by a stone ST.

Electrons which are not used for generating Cherenkov EUV radiation may pass through the mask and effect components arranged in the radiation path behind the mask. In order to prevent this, it may be arranged that the electron beam is slant with respect to the normal to the substrate. Then the said electrons are reflected by the mask so that they do not pass through the mask.

There are various possibilities of illuminating the substrate per IC area, i.e. for imaging a mask pattern in an IC area. For example, the electron beam EB may be scanned across the mask pattern in the X direction by means of the deflection plates 7 so that only a strip-shaped area of the mask, i.e. of the medium 21 is bombarded by electrons at any moment. Then, a strip-shaped area of this medium will emit EUV photons. Since the photons are emitted within a characteristic Cherenkov angle of approximately 8° and are captured by the projection system, a kind of ring field illumination is obtained. By scanning the electron beam, this illumination shifts across the mask. A ring field illumination has already been proposed for EUV and deep UV lithographic projection apparatuses as a good possibility of increasing their resolution.

The strip-shaped illumination of the mask pattern may be utilized in a step-and-scan projection apparatus because the mask pattern is illuminated only in the X direction and throughout its width at any moment. For the full-width illumination in the Y direction, the mask pattern and the substrate should be moved synchronously in this direction, the scan direction, with respect to the projection beam and the projection system. A step-and-scan lithographic projection apparatus is described in, for example, PCT patent application WO 97/33204 (PHQ 96004). When the novel radiation source unit is used in such an apparatus, the scanning can be realized in the Y direction by scanning the electron beam across the mask also in this direction. The electronic scanning must then be synchronized with the mechanical movement of the substrate. A more conventional method of scanning in the Y direction is moving the mask in that direction as well. Since the path of the electrons must be in vacuo, the mask must be arranged in the evacuated holder, as is shown in FIG. 1, or must at least shut off this holder, as is shown in FIG. 2. Then, special constructions are necessary for the mask holder and the mask table, which constructions are not subject of the present invention. If the radiation source unit is not too big and heavy, this unit may also be supported by the mask table and moved along with it. The electron beam must then be scanned across the mask also in the Y direction.

In a stepping apparatus, the electron beam, if having a sufficient energy, can be widened in such a way that it illuminates the entire mask pattern. Another possibility is to scan the electron beam across the mask pattern both in the X direction and in the Y direction.

Instead of four mirrors, the mirror projection system may alternatively have a different number of mirrors, for example, three, five or six. It generally holds that as the number of mirrors is larger, the accuracy of the image is better, but the radiation loss increases. Thus, a compromise will have to be found between the quality of the image and the radiation intensity on the substrate, which intensity also determines the throughput of the substrates through the apparatus. Mirror projection systems having three, five or six mirrors for lithographic apparatuses are known per se. For example, a six-mirror system is described in EP-A 0 779 528.

The mirror projection system is preferably designed in such a way that the free optical work distance, i.e. the distance between the last mirror of the system and the plane of the substrate is sufficiently large, so that optical sensors can be arranged in the space between this mirror and the substrate. Such sensors, which are already used in stepping apparatuses or in step-and-scanning apparatuses in which the projection system is a lens system, are, for example, a height and level sensor described in, for example, U.S. Pat. No. 5,191,200 (PHQ 91007) and an image sensor described in, for example, U.S. Pat. No. 5,144,363 (PHQ 90003).

The mirror projection system is preferably telecentric on the side of the substrate, which has the advantage that magnification errors due to unwanted movements in the Z direction of the substrate with respect to the projection system are prevented.

The EUV lithographic projection apparatus may not only be used in the manufacture of ICs but also in the manufacture of, for example, liquid crystalline display panels, integrated or planar optical systems, and magnetic heads.

What is claimed is:

1. A method of imaging, by means of EUV radiation, a mask pattern, present in a mask, in a radiation-sensitive layer provided on a substrate, using a mirror projection system, characterized in that use is made of an electron beam and of a medium in which Cherenkov EUV radiation is generated by electrons, and in that said medium is constituted by a layer of the mask.

2. A method as claimed in claim 1, characterized in that a layer of silicon is used as a Cherenkov radiation-generating medium.

3. A method as claimed in claim 1, characterized in that use is made of an electron beam which is slant with respect to the normal to the substrate.

4. A method of manufacturing devices comprising the steps of:

providing at least one mask with a mask pattern representative of a structure layer of the device;

imaging, by means of the EUV radiation, the said mask pattern onto at least one area of a substrate provided with a layer which is sensitive to the EUV radiation, in which area is a device is to be formed, the number of areas being equal to the number of devices to be formed in the substrate;

developing and further processing the images on the substrate area to convert these image into a layer structure of the devices, and repeating these steps with at least one other pattern until the complete device structure is formed in the substrate, characterized in that for generating the EUV radiation use is made of an electron beam generator for bomdarding the mask with electrons and of a mask comprising a medium wherein Cherenkov radiation is generated upon bombardment with electrons.

5. The method of claim 4, characterized in that the step of imaging the mask pattern comprises imaging the whole mask pattern area simultaneously.

6. The method of claim 4, characterized in that the step of imaging the mask pattern comprises scanning the mask pattern with an electron beam having, in the plane of the mask pattern an elongated cross-section the width of which is smaller than the mask pattern.

* * * * *